United States Patent [19]

Carlson et al.

[11] Patent Number: 4,854,974
[45] Date of Patent: Aug. 8, 1989

[54] ELECTRICAL CONTACTS FOR A THIN-FILM SEMICONDUCTOR DEVICE

[75] Inventors: David E. Carlson, Yardley, Pa.; Charles R. Dickson, Pennington; Robert V. D'Aiello, East Brunswick, both of N.J.

[73] Assignee: Solarex Corporation, Rockville, Md.

[21] Appl. No.: 197,433

[22] Filed: May 23, 1988

Related U.S. Application Data

[60] Division of Ser. No. 68,753, Jun. 29, 1987, Pat. No. 4,783,421, which is a continuation of Ser. No. 723,290, Apr. 15, 1985, abandoned.

[51] Int. Cl.$^4$ ............................................. H01L 27/14
[52] U.S. Cl. .................................... 136/244; 136/258; 357/65; 357/30
[58] Field of Search ........ 136/244, 258 AM, 249 MS; 357/65, 30

[56] References Cited

U.S. PATENT DOCUMENTS

| | | | |
|---|---|---|---|
| 4,191,794 | 3/1980 | Shirland et al. | 427/74 |
| 4,668,840 | 5/1987 | Kiyama et al. | 136/244 |
| 4,697,041 | 9/1987 | Okaniwa et al. | 136/244 |

Primary Examiner—Aaron Weisstuch
Attorney, Agent, or Firm—Finnegan, Henderson, Farabow, Garrett & Dunner

[57] ABSTRACT

A method of fabricating spaced-apart back contacts on a thin film of semiconductor material by forming strips of buffer material on top of the semiconductor material in locations corresponding to the desired dividing lines between back contacts, forming a film of metal substantially covering the semiconductor material and buffer strips, and scribing portions of the metal film overlying the buffer strips with a laser without contacting the underlying semiconductor material to separate the metal layer into a plurality of back contacts. The buffer material serves to protect the underlying semiconductor material from being damaged during the laser scribing. Back contacts and multi-cell photovoltaic modules incorporating such back contacts also are disclosed.

11 Claims, 2 Drawing Sheets

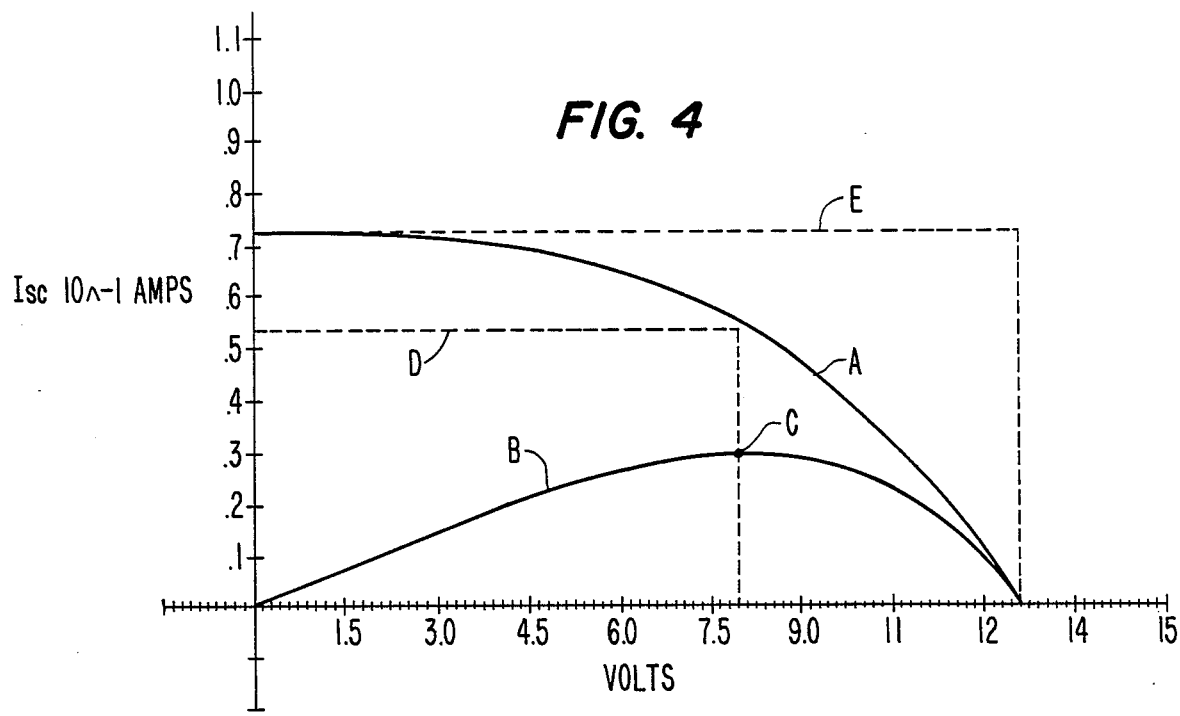
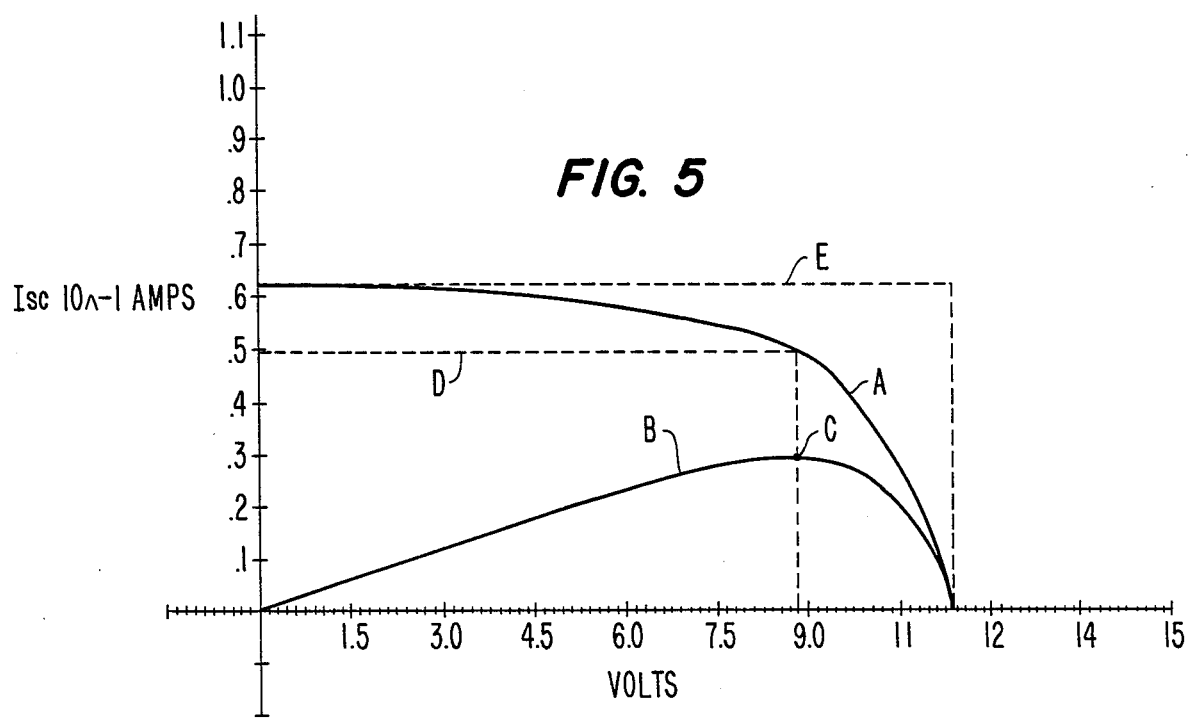

ELECTRICAL CONTACTS FOR A THIN-FILM SEMICONDUCTOR DEVICE

This is a division of application Ser. No. 068,753, filed June 29, 1987, now U.S. Pat. No. 4,783,421, which is a continuation of application Ser. No. 723,290, filed Apr. 15, 1985, now abandoned.

BACKGROUND OF THE INVENTION

1. Field of the Invention

The present invention relates to forming electrical contacts on thin-film semiconductor devices. 'Thin-film' semiconductor devices generally are understood to comprise layers of material each less than 10 micrometers (100,000 Å) thick sucessively fabricated on a flat substrate or superstrate. More particularly, the present invention relates to forming back contacts on photovoltaic cells comprised of thin films of amorphous silicon.

2. Description of the Related Art

As is well known in the thin-film semiconductor art, photovoltaic cells that convert solar radiation into usable electrical energy can be fabricated by sandwiching certain semiconductor structures, such as, for example, the amorphous silicon PIN structure disclosed in U.S. Pat. No. 4,064,521, between two electrical contacts. One of the contacts typically is transparent to permit solar radiation to reach the semiconductor material. This 'front' contact can be comprised of a thin film (i.e., less than 10 micrometers) of transparent conductive oxide material such as tin oxide and usually is formed between a transparent supporting superstrate made of glass or plastic and the photovoltaic semiconductor material. The "back" contact, which is formed on the surface of the semiconductor material opposite the front contact, generally comprises a thin film of metal such as, for example, aluminum.

The voltage produced across the contacts of a single-cell photovoltaic module, however, is insufficient for most applications. To achieve a useful power level from photovoltaic semiconductor devices, individual photovoltaic cells must be electrically connected in series. A typical arrangement of series-connected photovoltaic cells is shown in FIG. 1.

FIG. 1 shows photovoltaic module 10 comprised of a plurality of series-connected photovoltaic cells 11 formed on a transparent superstrate 12 and subjected to solar radiation 13 passing through superstrate 12. Each photovoltaic cell 11 includes a front contact 14 of transparent conductive oxide, a photovoltaic element 18 made of a semiconductor material such as, for example, hydrogenated amorphous silicon, and a back contact 22 of a metal such as aluminum. Photovoltaic element 18 can comprise, for example, a PIN structure. Adjacent front contacts 14 are separated by first grooves 16, which are filled with the semiconductor material of photovoltaic elements 18. The dielectric semiconductor material in first grooves 16 electrically insulates adjacent front contacts 14. Adjacent photovoltaic elements 18 are separated by second grooves 20, which are filled with the metal of back contact 22 to provide a series connection between adjacent front and back contacts. Adjacent back contacts 22 are electrically isolated from one another by third grooves 24.

The thin-film photovoltaic module of FIG. 1 typically is manufactured by a deposition and patterning method. One example of a suitable technique for depositing a semiconductor material on a superstrate is glow discharge in silane, as described, for example, in U.S. Pat. No. 4,064,521. Several patterning techniques are conventionally known for forming the grooves separating adjacent photovoltaic cells, including silkscreening with resist masks, etching with positive or negative photoresists, mechanical scribing, electrical discharge scribing, and laser scribing. Laser scribing and silkscreening methods have emerged as practical, cost-effective, high-volume processes for manufacturing thin-film semiconductor devices, including amorphous silicon photovoltaic modules. Laser scribing has an additional advantage over silkscreening because it can separate adjacent cells in a multi-cell device by forming separation grooves having a width less than 25 micrometers, compared to the minimum practical silkscreening groove width of approximately 125 micrometers. A photovoltaic module fabricated with laser scribing thus has a larger percentage of its surface area actively engaged in producing electricity and consequently has a higher efficiency than a module fabricated by silkscreening. A method of laser scribing the layers of a photovoltaic module is disclosed in U.S. Pat. No. 4,292,092.

Referring to FIG. 1, a method of fabricating a multi-cell photovoltaic module using laser scribing comprises: depositing a continuous film of transparent conductive oxide on a transparent superstrate 12, scribing first grooves 16 to separate the transparent conductive oxide film into front contacts 14, fabricating a continuous film of a photovoltaic semiconductor material on top of front electrodes 14 and in first grooves 16, scribing second grooves 20 parallel and adjacent to first grooves 16 to separate the semiconductor material into individual photovoltaic elements 18, forming a continuous film of metal on elements 18 and in second grooves 20 so that the metal forms electrical connections with front contacts 14, and then scribing third grooves 24 parallel and adjacent to second grooves 20 to separate adjacent back contacts 22.

Complete reliance on laser scribing to pattern photovoltaic modules has not been practical, however, because scribing third grooves 24 to separate back contacts 22 has been found to damage the underlying semiconductor material of photovoltaic elements 18. When the photovoltaic elements are comprised of amorphous silicon, the damage resulting from laser scribing the overlying back contacts includes recrystallization of the amorphous silicon. Such recrystallization tends to create electrical connections between adjacent back contacts, which produces short circuits between paired front and back contacts and substantially reduces the efficiency of the photovoltaic module. Shorting also can result from the laser causing the back contact metal to diffuse into the underlying semiconductor material to form conductive alloys. Consequently, in prior art patterning methods, silkscreening with acid etching must generally be used to form the grooves separating the back contacts and to produce an operable photovoltaic module.

Reliance on silkscreening, however, reduces the active area (i.e., the current producing and collecting area) of the photovoltaic module and therefore reduces its photovoltaic efficiency. Acid etching also requires additional processing steps that significantly decrease output and increase labor costs. Etching third grooves 24 separating back contacts 22 requires the steps of (1) forming a silkscreened pattern over the metal layer to cover the back contacts and expose the desired dividing lines between the back contacts, (2) etching the exposed portions of the metal with acid to form third grooves 24, (3) rinsing the photovoltaic module to remove the acid, (4) applying a solvent to remove the silkscreened pattern, (5) rinsing the photovoltaic module to remove the solvent, and (6) drying the photovoltaic module.

The present invention is intended to eliminate the disadvantages of acid etching by providing a method of forming back contacts on thin-film semiconductor devices, including amorphous silicon photovoltaic modules, by laser scribing the grooves separating the back contacts without damaging the underlying semiconductor material and producing deleterious electrical shorts.

The present invention also is intended to provide a multi-cell photovoltaic module having increased power, efficiency, and reliability through the use of laser scribing to form all the grooves separating adjacent cells.

Additional advantages of the present invention will be set forth in part in the description that follows and in part will be obvious from that description or can be learned by practice of the invention. The advantages of the invention can be realized and obtained by the method and device particularly pointed out in the appended claims.

SUMMARY OF THE INVENTION

The present invention overcomes the problems of the prior art methods of forming back contacts of a conductive material on thin-film semiconductor devices by forming strips of buffer material beneath the portions of the back contact film to be laser scribed. The buffer strips are formed of a material that absorbs or reflects the incident laser radiation, thus protecting the underlying semiconductor layer from being recrystallized or otherwise damaged and preventing it from shorting out the semiconductor device.

To overcome the problems of the prior art methods and in accordance with the purpose of the invention, as embodied and broadly described herein, the method of this invention of forming spaced-apart electrical contacts on a thin film of semiconductor material comprises the steps of: forming regions comprised of a buffer material over the semiconductor material at locations corresponding to the desired open spacing between the contacts; forming a layer of conductive material over the semiconductor material and the regions of buffer material; and removing portions of the conductive material layer overlying the regions of buffer material without contacting the underlying semiconductor material to separate the conductive material layer into a plurality of spaced-apart contacts.

This invention further includes a method of fabricating substantially flat electrical contacts spaced apart on a thin film of semiconductor material, comprising the steps of: forming strips of a buffer material over the semiconductor material at locations corresponding to the desired open spacings between the contacts; forming a substantially continuous layer of conductive material over the semiconductor material and the buffer strips; and removing portions of the conductive material layer overlying the buffer strips, typically by laser scribing, to form a plurality of grooves separating the conductive material into a plurality of spaced-apart contacts, the grooves extending completely through the conductive material layer without contacting the underlying semiconductor material, the buffer strips being adapted to prevent the underlying semiconductor material from being damaged during the removal step.

Broadly, the present invention further includes a method of fabricating a multi-cell photovoltaic module comprising the steps of: forming a layer of transparent conductive oxide, preferably tin oxide, on a flat transparent superstrate; scribing the conductive oxide layer with a laser to form a plurality of first grooves separating the conductive oxide layer into a plurality of transparent front contacts; fabricating a thin film of photovoltaic semiconductor material, preferably amorphous silicon, on the conductive oxide layer, the semiconductor material filling the first grooves to electrically insulate adjacent front contacts; scribing the semiconductor film with the laser parallel and adjacent to the first grooves to form a plurality of second grooves separating the semiconductor film into a plurality of photovoltaic elements; forming strips of a buffer material, preferably black silkscreen resist ink, on the photovoltaic elements parallel and adjacent to the second grooves; forming a layer of metal, preferably aluminum, substantially covering the photovoltaic elements and the buffer strips, the metal filling the second grooves to form electrical connections with the front contacts; and scribing portions of the metal layer overlying the buffer strips with the laser without contacting the photovoltaic elements to form a plurality of third grooves separating the metal layer into a plurality of back contacts electrically connected to adjacent ones of the front contacts.

The back electrical contacts of this invention for a thinfilm semiconductor device having at least one substantially flat layer of a semiconductor material comprise a plurality of conductive material regions formed on one surface of the semiconductor material layer and separated from one another by substantially parallel grooves; and strips of buffer material sandwiched between the semiconductor material layer and the conductive material regions, each of the strips underlying one of the grooves.

Broadly, this invention further includes a multi-cell photovoltaic module comprising: a flat, transparent superstrate; a plurality of front contacts of a conductive transparent oxide, preferably tin oxide, formed on the superstrate and separated by substantially parallel first grooves; a plurality of photovoltaic elements of a semiconductor material, preferably amorphous silicon, formed on the front contacts and filling the first grooves to electrically insulate adjacent front contacts, the photovoltaic elements being separated by second grooves parallel and adjacent to the first grooves; a plurality of strips of a buffer material, preferably black silkscreen resist ink, formed on the photovoltaic elements parallel and adjacent to the second grooves; and a plurality of back contacts of a conductive material, preferably aluminum, formed on the photovoltaic elements and the buffer strips and being separated by third grooves overlying the buffer strips, the conductive material filling the second grooves to form electrical connections between adjacent front and back contacts.

The accompanying drawings, which are incorporated in and which constitute a part of this specification, illustrate one embodiment of the invention and, together with the description, explain the principles of the invention.

BRIEF DESCRIPTION OF THE DRAWINGS

FIG. 4 is a graph showing the current-voltage curve of a photovoltaic module fabricated according to the prior art method; and FIG. 5 is a graph showing the current-voltage curve of a photovoltaic module fabricated according to the method of the present invention.

DESCRIPTION OF THE PREFERRED EMBODIMENTS

Reference now will be made in detail to a presently preferred embodiment of the invention, an example of which is illustrated in the accompanying drawings.

Figure 1:
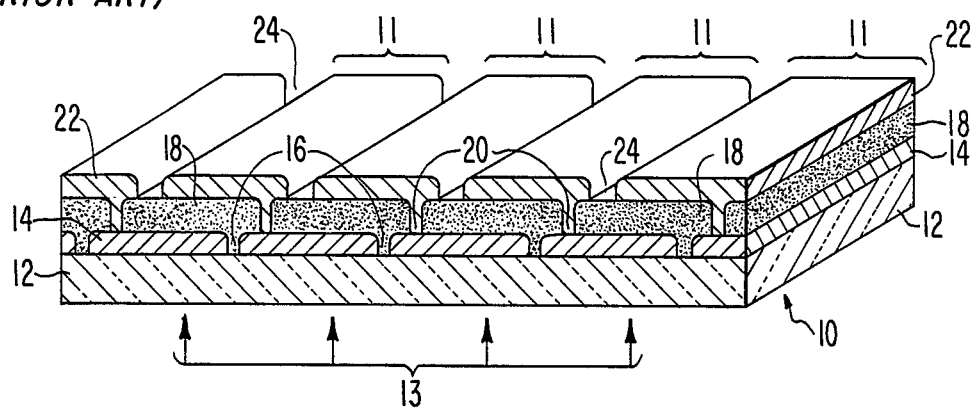
FIG. 1 is a schematic perspective view of a prior art photovoltaic module fabricated according to a prior art method.
Figure 2:
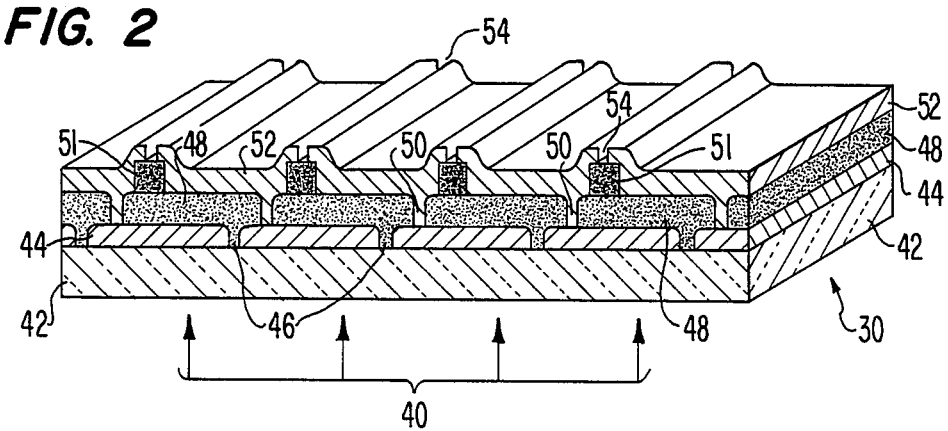
FIG. 2 shows a schematic perspective view of a photovoltaic module of the present invention fabricated according to the method of the present invention.

FIG. 2 shows a series-connected, multi-cell photovoltaic module 30 fabricated according to the method of the present invention. Module 30 comprises a superstrate 42 of glass or other conventional material transparent to solar radiation 40. Superstrate 42 provides a substantially rigid base for the production of the photovoltaic module and provides physical support for the module elements during operation.

Front electrical contacts 44 comprised of a transparent conductive oxide such as, for example, fluorinated tin oxide are formed on superstrate 42 and are separated by first grooves 46 in a manner well known in the art. See, for example, U.S. Pat. No. 4,292,092, the disclosure of which is incorporated herein by reference to the extent necessary to achieve a thorough understanding of the background of the invention. Preferably, transparent front contacts 44 and first grooves 46 are parallel to each other.

The thickness of front contact 44 varies depending upon the particular desired application of the photovoltaic module. For applications in solar-powered calculators, for example, the front contacts typically are approximatly 1700 Å thick. In photovoltaic power modules, the front contacts typically are approximately 5000 Å thick. First grooves 46 separating adjacent front electrodes 44 typically are approximately 10–25 micrometers in width.

Photovoltaic semiconductor elements 48 are formed on top of front contacts 44 in a conventional manner. See, for example, U.S. Pat. No. 4,064,521, the disclosure of which is incorporated herein by reference to the extent necessary to achieve a thorough understanding of the background of the invention. The semiconductor material of elements 48 fills first grooves 46. Because they are comprised of a dielectric material, photovoltaic elements 48 electrically insulate adjacent front contacts 44. Preferably, elements 48 are comprised of hydrogenated amorphous silicon in a PIN structure as conventionally known having a typical thickness of approximately 6000 Å. Adjacent elements 48 are separated by second grooves 50, which are parallel and adjacent to first grooves 46 and typically are approximately 10–25 micrometers in width. Second grooves 50 may, for example, be laser scribed in a conventional manner. See, for example, U.S. Pat. No. 4,292,092.

Figure 3:
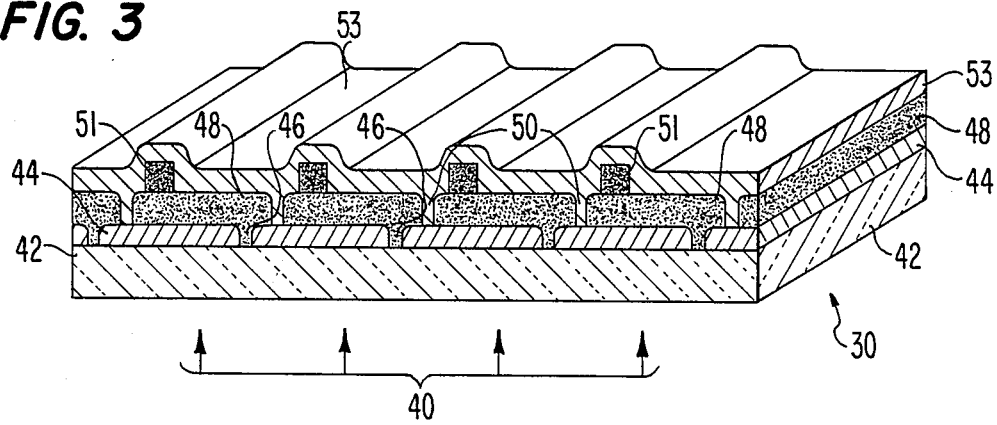
FIG. 3 shows a schematic perspective view of the photovoltaic module of FIG. 2 prior to forming the grooves separating adjacent back contacts.

In accordance with the present invention, buffer strips 51 are formed on photovoltaic elements 48 preferably parallel and adjacent to second grooves 50. Buffer strips 51 are approximately 125–375 micrometers in width and are comprised of a non-conductive material that either absorbs or reflects laser light. The function and configuration of the buffer strips and a description of the preferred buffer materials are set forth in greater detail below. The buffer strip configuration shown in FIGS. 2 and 3 is merely exemplary, as will be explained below.

Referring still to FIG. 2, back contacts 52, typically comprised of a conductive material such as aluminum, are formed on top of photovoltaic elements 48. The conductive material fills second grooves 50, thus providing electrical connections between individual back contacts 52 and individual front contacts 44. Adjacent back contacts 52 are electrically separated by buffer strips 51 and third grooves 54, which overlie buffer strips 51. Third grooves 54 also have a typical width of approximately 10–25 micrometers. The narrow width of grooves 46, 50, 54 serves to maximize the active area of photovoltaic module 30.

The method of the present invention as applied to the fabrication of a thin-film, multi-cell photovoltaic semiconductor module now will be described with reference to FIGS. 2 and 3.

First, as discussed previously, a substantially continuous film of transparent conductive oxide material, preferably fluorinated tin oxide, is formed on flat, transparent superstrate 42 in a manner well known in the art. The thickness of the transparent conductive oxide film will vary depending upon the desired application of the photovoltaic module. For example, the conductive oxide film of modules used in solar-powered calculators preferably has a thickness of approximately 1700 Å, while power modules preferably have a conductive oxide film thickness of approximately 5000 Å.

The conductive oxide film then is scribed in a conventional manner, preferably with a laser, to form parallel first grooves 46 dividing the conductive oxide film into parallel front contacts 44. U.S. Pat. No. 4,292,092 discloses one suitable laser scribing technique, although certainly not the only suitable technique. Scribing can be performed either by moving the laser with respect to the module or, preferably, by mounting the module on an X-Y table that is movable with respect to the laser. Scribing can be done either from the front (through superstrate 42) or from the back (directly on the conductive oxide film). The resulting first grooves preferably are approximately 10–25 micrometers in width.

A photovoltaic region comprised of a substantially continuous thin film of semiconductor material then is fabricated over front contacts 44. The semiconductor material fills first grooves 46 and provides electrical insulation between adjacent front contacts 44. Preferably, the photovoltaic region is made of hydrogenated amorphous silicon in a PIN structure and is approximately 6000 Å in thickness, being comprised of a p-layer of 120 Å, an i-layer of 5200–5500 Å, and an n-layer of 500 Å. Deposition preferably is by glow discharge in silane. See, for example, U.S. Pat. No. 4,064,521.

The photovoltaic semiconductor region then is scribed, preferably by laser scribing, to form second grooves 50 separating adjacent photovoltaic elements 48. Scribing may be performed with the same laser used to scribe the transparent conductive oxide layer, except that power is reduced. The laser scribing of the semiconductor layer also can be performed from either side of the superstrate. Scribing from the front side at a low power level removes the semiconductor material without damaging the front contacts. Second grooves 50 preferably are scribed adjacent and parallel to first grooves 46 and preferably are approximately 10-25 micrometers in width.

According to prior art laser scribing methods, the next steps would be to form a substantially continuous film of conductive material on top of the photovoltaic elements and then laser scribe to form grooves separating the conductive material film into a plurality of back contacts. This method, as taught, for example, by U.S. Pat. No. 4,292,092, has proved to be impractical. Because of the high reflectivity of aluminum and other metals conventionally used to form the back contacts, the laser used to scribe the back contact film must be operated at significantly higher power levels than those used to scribe the grooves in the photovoltaic elements, often as much as ten times higher. We have found that it is difficult to prevent a laser operating at that power level from damaging the underlying photovoltaic elements. Where the underlying photovoltaic elements are comprised of amorphous silicon, we have discovered that scribing the overlying back contact film partially recrystallizes the amorphous silicon, which forms electrical connections between adjacent back contacts, shorting out paired front and back contacts and substantially impairing efficiency.

Although one solution to the problem is to use acid etching to form the grooves separating the back contacts, we have discovered that laser scribing can be used on the back contact film if a material is interposed between the photovoltaic semiconductor region and the portions of the back contact film to be scribed in order to serve as a buffer between the laser and the semiconductor material. Therefore, in accordance with the present invention, after laser scribing second grooves 50, strips 51 of buffer material are formed on photovoltaic elements 48 adjacent and parallel to second grooves 50. The purpose of the strips, referred to herein as "buffer strips," is to shield the underlying semiconductor material from recrystallization and other damaging effects during laser scribing of the back contact film.

The buffer material can be any flowable, patternable, nonconductive material that will either absorb or reflect the light emitted by the laser during scribing of the back contact film to prevent the laser light from contacting the underlying semiconductor region. Because absorption and reflectivity characteristics vary with the frequency of light, differing buffer materials might prove optimal for different laser wavelengths. Other scribing parameters, such as laser operating power, also vary with wavelength. Thus, the buffer material can be selected to optimize conditions during laser scribing of the back contact film.

We have found that, when a frequency-doubled neodymium YAG laser having a wavelength of 0.53 micrometers is used to scribe the back contacts, a conventional black silkscreen resist ink is one preferred buffer material for absorbing the laser light. Conventional black epoxy materials also can be used to absorb the laser light. Suitable buffer materials for reflecting the laser light include, for example, conventional white epoxy materials and white silkscreen resist ink. Materials that are colored neither black nor white also would be suitable as buffer materials if they absorb and/or reflect sufficient laser light to protect the underlying semiconductor material. Some buffer materials may require drying or curing before applying the back contact material in order to obtain optimum results.

Various conventional means can be used to form buffer strips 51, such as, for example, silkscreening, ink jet printing, bead laying, or flowing the material through a nozzle. The presently preferred method of forming buffer strips 51 is silkscreening, because silkscreening enables the deposition of buffer strips having substantially uniform width and thickness.

Buffer strips 51 preferably are about 25-50 micrometers thick and about 125-375 micrometers wide. More preferably, buffer strips 51 are approximately 50 micrometers thick to ensure sufficient protection of the underlying semiconductor material. It also is more preferred to maintain the buffer strips at a width of about 125 micrometers, when utilizing a laser capable of scribing grooves about 10-25 micrometers wide, to maximize the active area and efficiency of the photovoltaic module while allowing for misalignment between buffer strips 51 and third grooves 54. Where more precise alignment is obtainable, narrower buffer strips can be used.

The substantially rectangular shape of buffer strips 51 in FIGS. 2 and 3 is merely exemplary. The purpose of the buffer strips is served as long the buffer material underlying the portions of the back contact layer to be scribed by the laser is of a thickness sufficient to protect the underlying photovoltaic elements from being damaged by the laser. Because of difficulties in aligning the scribe lines precisely over the buffer strips over the entire length of the strips, the buffer strips preferably are wider than the grooves formed by the laser to ensure that buffer material is interposed between the photovoltaic elements and the incident laser light. As is understood in the art, buffer strips that are substantially rectangular in cross section, have a uniform thickness sufficient to protect the underlying photovoltaic elements, and have a uniform width sufficient to account for misalignment with the scribing lines will serve their purpose without unnecessarily wasting buffer material.

Referring to FIG. 3, after the buffer strips are formed and, if necessary, dried or cured, a substantially continuous film 53 of conductive material, preferably aluminum, is formed to cover the photovoltaic elements and the buffer strips. Conductive film 53 is formed, for example, by sputtering or other well known techniques and typically is approximately 1700 Å thick for calculator modules and typically about 3500 Å thick for power modules. The conductive material fills second grooves 50 to form electrical connections with underlying front contacts 44.

Portions of film 53 overlying buffer strips 51 then are laser scribed from the back to form third grooves 54, shown in FIG. 2, separating the conductive material film into parallel, spaced-apart back contacts 52, which are in series connection with adjacent front contacts 44 through second grooves 50. When the conductive material is aluminum, the scribing of the film 53 preferably is performed with a frequency-doubled neodymium YAG laser emitting light having a wave-length of about 0.53 micrometers, at a power of approximately 100-150 mW in a $TEM_{00}$ (spherical) mode focused to less than 25 micrometers with a depth of field of 500 micrometers. The pulse rate of the laser preferably is approximately 5 kHz. The feed rate, the rate at which either the laser or the X-Y table is moved, preferably is 5-10 centimeters per second. Buffer strips 51 either absorb or reflect the laser light after it has passed through the conductive material 52 and protect the underlying photovoltaic semiconductor elements from being damaged by the laser and from recrystallizing and shorting out the modules.

The invention is illustrated further by the following examples comparing the performance of photovoltaic modules having back contacts fabricated according to the present invention with photovoltaic modules having back contacts spaced apart by acid etching.

EXAMPLE I

Test specimens of photovoltaic modules designed for lowlight-level applications such as power sources for solar-powered calculators were used to compare the effectiveness of laser scribing the back contacts over buffer strips in accordance with the present invention with metal patterning by silkscreened acid etching. Each test module was approximately 29.6 mm long by 11.8 mm wide and comprised four series-connected photovoltaic cells.

Lots of 100 calculator modules were fabricated on 20.5 cm square sheets of glass 1.1 mm thick. Each module in an individual lot was fabricated according to identical conditions except for the method used to fabricate the back contacts. To fabricate the back contacts, each lot of 100 was split so that half of the modules were laser scribed over buffer strips in accordance with the present invention, and half of the modules were metal patterned by silkscreen etching with acid.

First, a transparent conductive oxide layer of unenhanced fluorinated tin oxide was deposited by chemical vapor deposition on each glass superstrate to a thickness of approximately 1700 Å. The sheet resistivity of the tin oxide layer was about 100 ohms per square. The tin oxide layer then was scribed with a neodymium YAG laser to form parallel grooves approximately 25–50 micrometers wide separating the tin oxide layer into parallel front contacts. See, for example, FIG. 2.

A photovoltaic region of hydrogenated amorphous silicon having a PIN structure then was deposited on the tin oxide layer by a glow discharge method. The photovoltaic region comprised a p-layer approximately 120 Å thick, an i-layer approximately 5200 Å thick, and an n-layer approximately 500 Å thick. The amorphous silicon then was scribed adjacent and parallel to the scribe lines of the tin oxide layer with the neodymium YAG laser to form parallel grooves approximately 25–50 micrometers wide separating the amorphous silicon region into parallel photovoltaic elements. See, for example, FIG. 2.

Next, on one half of the sheet, buffer strips comprised of Colonial Printing Ink Company ER-4029 black acid-etch resist were applied adjacent and parallel to the scribed lines in the amorphous silicon region by conventional silkscreening. The buffer strips were approximately 25–50 micrometers thick and 125–375 micrometers wide. The buffer strips were dried by heating in an annealing oven at 120°–150° C. for about 15 minutes. A back contact layer of aluminum approximately 1700 Å thick then was deposited by sputtering to cover the amorphous silicon region and buffer strips. See, for example, FIG. 3.

The sheets then were cut into two pieces to separate the modules with the buffer strips from the modules lacking buffer strips. The modules without the buffer strips were subjected to acid etching. First, an acid etch resist pattern was silk-screened over the aluminum back contact layer to expose only those portions of the aluminum layer corresponding to the dividing lines between adjacent back contacts. The grooves separating adjacent back contacts then were formed by acid etching using a solution of 70% phosphoric acid, 10% acetic acid, 15% nitric acid, and 5% water, by volume. The acid-etched modules then were rinsed in water and dried, washed with a resist solvent (butyl cellusolve) to remove the acid etch resist, rinsed again in water to remove the resist solvent, and dried.

The modules having the buffer strips were scribed with a frequency-doubled neodymium YAG laser emitting light of a wavelength of 0.53 micrometers in a $TEM_{00}$ mode focused to less than 25 micrometers with a depth of field of approximately 500 micrometers. The laser was operated at a power of approximately 150 mW with a pulse rate of about 5 kHz and a scribing feed rate of approximately 7.5 centimeters per second to form grooves in the metal film overlying the buffer strips and to separate the aluminum layer into back contacts. See, for example, FIG. 2.

The two sets of photovoltaic modules then were tested on a standard light test table having a fluorescent light source with an intensity of 200 lux. Each individual module was tested to determine whether it produced both the minimum acceptable operating voltage of 1.5 volts and minimum acceptable operating current of 6 microamps. The sheets containing the modules then were annealed at 150° C. for 60 minutes and retested. "Yields" were determined by dividing the number of modules in each lot exceeding both the minimum voltage and minimum current when exposed to 200 lux of illumination by the number of modules tested and multiplying by 100 to obtain the passing percentage.

Table I sets forth results of comparison tests performed under the above conditions on seven lots of 100 photovoltaic calculator modules each. The abbreviation "NT" indicates that the modules were not tested prior to annealing. We have found, and these test results show, that the modules fabricated according to the present invention produce yields that are consistently equal to or greater than the prior art acid-etch method. In none of the lots did the acid etching produce a higher yield than the laser scribing method of the present invention. Although lot 8403 produced equal yields for the two methods after annealing, the method of the present invention produced higher yields for the remaining lots, both before and after annealing.

TABLE I

| LOT | ELECTRODE PATTERNING PROCESS | % PASSED BEFORE ANNEAL | % PASSED AFTER ANNEAL |
|---|---|---|---|
| 8405H | Acid | 1.8 | 3.6 |
|  | Laser | 8.9 | 35.7 |
| 8402F | Acid | 5.4 | 5.4 |
|  | Laser | 8.9 | 12.5 |
| 8402J | Acid | 19.6 | 21.4 |
|  | Laser | NT | 41.1 |
| 8410I | Acid | 0.0 | 0.0 |
|  | Laser | 8.9 | 23.2 |
| 8403 | Acid | 17.9 | 28.6 |
|  | Laser | 32.1 | 28.6 |
| 8402K | Acid | NT | 26.8 |
|  | Laser | NT | 33.9 |
| 8402J | Acid | 116.0 | 21.4 |
|  | Laser | 36.7 | 61.0 |

Additional tests were conducted to determine the effect on the passing rate of increasing the power of the laser during scribing of the back contacts. Again, 100-module lots were fabricated under identical conditions except for the back-contact-patterning process, substantially as described above. Table II shows the results of the yield tests for modules having back contacts that were scribed at 150, 160 and 170 mW. The difference in laser power, of course, pertains only to the modules having laser-patterned back contacts. At higher laser power, the yields of the modules fabricated according to the present invention are diminished and compare unfavorably with the yields available from acid etching. The decreased performance levels in the laser-scribed modules are believed to be due to the laser power exceeding the capacity of the buffer strips to absorb the incident radiation and prevent the laser from damaging the underlying amorphous silicon. At such high power levels, recrystallization of the amorphous silicon underlying the back contact scribe lines probably occurs, shorting out portions of the modules. The lots reported in Table II were produced in batches separated from the lots reported in Table I. Because manufacturing conditions can vary slightly between different batches, no correlation should be made between the results in Table I and the results in Table II.

TABLE II

| LOT | LASER POWER (mW) | ELECTRODE PATTERNING PROCESS | % PASSED BEFORE ANNEAL | % PASSED AFTER ANNEAL |
|---|---|---|---|---|
| 91708 | 150 | Acid | 78.6 | 87.5 |
|  |  | Laser | 71.4 | 83.7 |
| 91706 | 160 | Acid | 67.9 | 87.5 |
|  |  | Laser | 73.5 | 69.4 |
| 91710 | 170 | Acid | NT | 94.6 |
|  |  | Laser | NT | 36.7 |

EXAMPLE II

Further tests were conducted on 15-cell photovoltaic power modules fabricated on 10 cm square glass superstrates 0.32 cm thick. The power modules were fabricated similarly to the calculator modules of Example I, one set having back contacts fabricated according to the method of the present invention, and the other set having back contacts formed by acid etching. All of the power modules on an individual superstrate however, were produced by the same method.

Also, the individual layers of the power modules had thicknesses different from the corresponding films of the calculator modules. The unenhanced fluorinated tin oxide layers of the power modules were 5000 Å thick and had a sheet resistivity of 20-30 ohms per square. The hydrogenated amorphous silicon photovoltaic regions of the power modules were approximately 5800 Å in thickness, having a p-layer of about 100 Å, an i-layer of about 5200 Å, and an n-layer of about 500 Å. The aluminum back contact layer was 3500 Å thick. The silkscreened buffer strips of the laser-scribed power modules had the same approximate dimensions (25–50 micrometers thick and 125–375 micrometers wide) as the buffer strips of the calculator modules tested in Example I.

FIGS. 4 and 5 show current-voltage curves A for representative power modules fabricated, respectively, with prior art acid-etched back contacts and with back contacts laser scribed in accordance with the present invention. Superimposed on the graphs of FIGS. 4 and 5 are curves B showing the power output (the product of the voltage and current) of the modules as a function of voltage. Points C designate maximum power output. Dashed lines D locate the current and voltage for the tested modules at maximum power output. The area under each rectangular dashed line D, therefore, represents the maximum power of each module. Dashed lines E define rectangles representing the product of the short-circuit current and open-circuit voltage, the theoretical maximum power of an idealized module, for each module tested. The fill factor, FF, is defined as the ratio of the actual maximum power to the product of short-circuit current and open-circuit voltage. Graphically, the fill factor is represented by the ratio of the area of the rectangle defined by line D to the area of the rectangle defined by line E.

The acid-etched power module of FIG. 4 was tested with illumination of 98.26 $mW/cm^2$ at an ambient temperature of 28.7° C. The laser-scribed power module of FIG. 5 was tested with 99.89 $mW/cm^2$ at 28.2° C. The fill factor was 0.463 for the power module having acid-etched back contacts and 0.615 for the power module having back contacts fabricated according to the present invention. Photovoltaic efficiencies for the two modules were relatively modest, 5.2% for the module of the prior art method and 5.3% for the module of the method of this invention. Neither of the tested modules, however, was constructed to optimize its efficiency. The purpose of the test was to obtain comparative results between similar constructions using the different methods of fabricating the back contacts.

It will be apparent to those skilled in the art that modifications and variations can be made in the method and device of this invention without departing from the scope of the invention. For example, the method can be applied to manufacturing contacts on thin-film semiconductor devices other than photovoltaic devices, such as thin-film transistors, and on photovoltaic devices having photovoltaic elements comprised of materials other than amorphous silicon. Also, laser scribing can be performed at wavelengths other than those disclosed in the present application, and different buffer materials can be used either to absorb or reflect incident laser light during the scribing of the back contacts. Metals other than aluminum can be used to form the back contacts. The method of the present invention also can be applied to methods using means other than laser scribing to form the spacing grooves between adjacent back contacts. Buffer strips also will serve to protect the underlying semiconductor material from such processes as mechanical scribing and electrical discharge scribing. The invention in its broader aspects is, therefore, not limited to the specific details and illustrated examples shown and described. Accordingly, it is intended that the present invention cover such modifications and variations, provided that they fall within the scope of the appended claims and their equivalents.

What is claimed is:

1. A thin-film semiconductor device having back electrical contacts and at least one substantially flat layer of a semiconductor material, comprising:
  a plurality of conductive material regions formed on one surface of said semiconductor material layer and separated from one another by substantially parallel grooves; and
  strips of buffer material sandwiched between said semiconductor material layer and said conductive material regions, each of said strips underlying one of said parallel grooves.

2. The thin-film semiconductor device of claim 1, wherein said buffer strips are approximately 125 micrometers in width and 50 micrometers in thickness and said grooves are approximately 10-25 micrometers in width.

3. The thin-film semiconductor device of claim 1, wherein said conductive material is aluminum.

4. The thin-film semiconductor device of claim 1, wherein said buffer material is selected from a group consisting of black epoxy and black silkscreen resist ink.

5. The thin-film semiconductor device of claim 1, wherein said buffer material is comprised of a material selected from a group consisting of white epoxy and white silkscreen resist ink.

6. A multi-cell photovoltaic module, comprising:
   a. a flat, transparent superstrate;
   b. a plurality of front contacts of a conductive transparent oxide material formed on said superstrate and separated by substantially parallel first grooves;
   c. a plurality of photovoltaic elements of a semiconductor material formed on said front contacts and filling said first groove to electrically insulate adjacent front contacts, said photovoltaic elements being separated by second grooves parallel and adjacent to said first grooves; and
   d. a plurality of strips of buffer material formed on said photovoltaic elements parallel and adjacent to said second grooves; and
   e. a plurality of back contacts of a conductive material formed on said photovoltaic elements and said buffer strips and being separated by third grooves overlying said buffer strips, said conductive material filling said second grooves to form electrical connections between adjacent front and back contacts.

7. The photovoltaic module of claim 6, wherein said front contacts are comprised of tin oxide.

8. The photovoltaic module of claim 6, wherein said semiconductor material is amorphous silicon.

9. The photovoltaic module of claim 6, wherein said conductive material is aluminum.

10. The photovoltaic module of claim 6, wherein said buffer material is selected from the group consisting of black epoxy and black silkscreen resist ink.

11. The photovoltaic module of claim 6, wherein said buffer strips are approximately 125 micrometers in width and approximately 50 micrometers in thickness and said third grooves are approximately 10-25 micrometers in width.

* * * * *

UNITED STATES PATENT AND TRADEMARK OFFICE
CERTIFICATE OF CORRECTION

PATENT NO. : 4,854,974
DATED : August 8, 1989
INVENTOR(S) : Carlson et al.

It is certified that error appears in the above-identified patent and that said Letters Patent is hereby corrected as shown below:

In column 1, line 4, after the title of the invention and "BACKGROUND OF THE INVENTION" insert --The Government of the United States of America has rights in this invention pursuant to Subcontract No. SERI ZB-4-03056-3 awarded by the U.S. Department of Energy.--

Signed and Sealed this

Thirteenth Day of April, 1993

Attest:

STEPHEN G. KUNIN

*Attesting Officer*          *Acting Commissioner of Patents and Trademarks*